(12) United States Patent
Zella et al.

(10) Patent No.: US 9,929,731 B2
(45) Date of Patent: Mar. 27, 2018

(54) DRIVER CIRCUIT, CORRESPONDING DEVICE AND METHOD

(71) Applicant: STMicroelectronics S.r.l, Agrate Brianza (IT)

(72) Inventors: Daniele Zella, Voghera (IT); Vanni Poletto, Casale Monferrato (IT); Mauro Foppiani, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/275,363

(22) Filed: Sep. 24, 2016

(65) Prior Publication Data
US 2017/0237427 A1    Aug. 17, 2017

(30) Foreign Application Priority Data

Feb. 16, 2016 (IT) .................. 102016000015826

(51) Int. Cl.
| | |
|---|---|
| *H03K 3/00* | (2006.01) |
| *H03K 17/687* | (2006.01) |
| *G05F 3/26* | (2006.01) |
| *H03K 17/60* | (2006.01) |

(52) U.S. Cl.
CPC .......... *H03K 17/6872* (2013.01); *G05F 3/26* (2013.01); *H03K 17/60* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 5,757,213 A | 5/1998 | Moller | |
| 6,348,820 B1 | 2/2002 | Bennett et al. | |
| 6,710,632 B2* | 3/2004 | Tada ................... | H03K 17/687 327/108 |
| 7,579,880 B2* | 8/2009 | Ueda ................ | H03K 17/04123 326/83 |
| 7,843,246 B2* | 11/2010 | Ozalevli ................. | H03K 5/08 327/110 |
| 2001/0030557 A1 | 10/2001 | Niimi | |
| 2010/0117707 A1* | 5/2010 | Ozalevli ............ | H03K 17/0822 327/309 |

FOREIGN PATENT DOCUMENTS

DE          10240167 A1    3/2004

\* cited by examiner

*Primary Examiner* — Long Nguyen
(74) *Attorney, Agent, or Firm* — Slater Matsil, LLP

(57) ABSTRACT

In one embodiment, a (pre)driver circuit includes first and a second output terminal for driving an electronic switch that includes a control terminal and a current path through the switch. The arrangement can operate in one or more first driving configurations (e.g., for PMOS), with the first and second output terminals are coupled to the current path and the control electrode of the electronic switch, respectively, and one or more second driving configurations (e.g., for NMOS, both HS and LS), wherein the first and second output terminals of the driver circuit are coupled to the control electrode and the current path of the electronic switch, respectively.

20 Claims, 5 Drawing Sheets

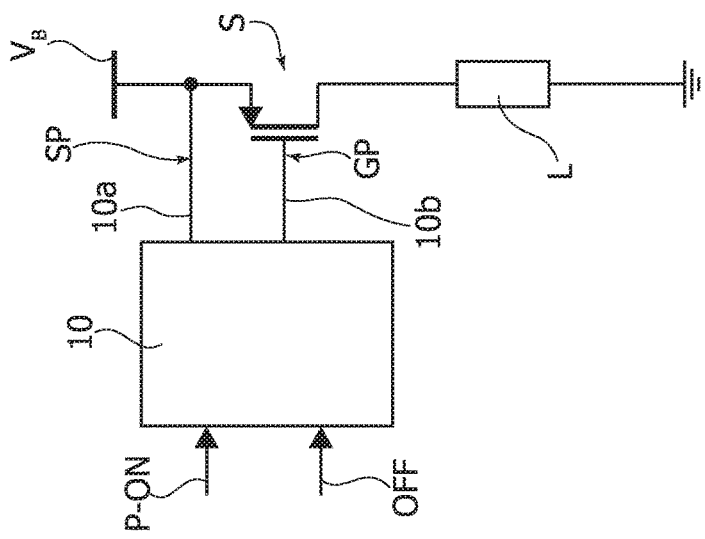
FIG. 1
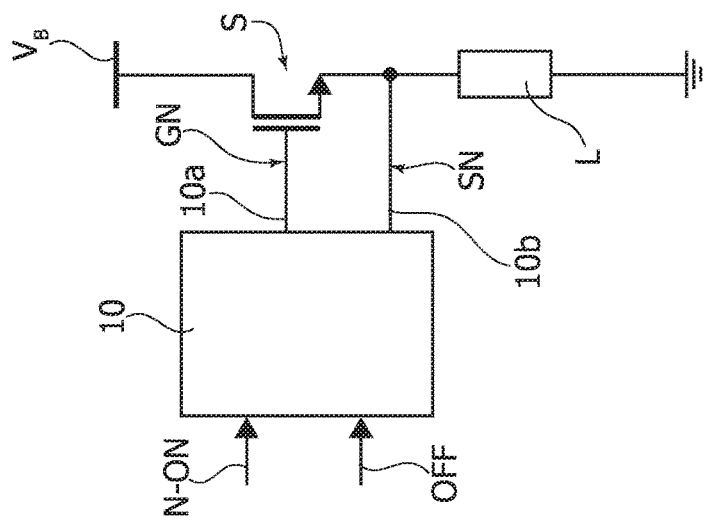
FIG. 2
FIG. 3

DRIVER CIRCUIT, CORRESPONDING DEVICE AND METHOD

CROSS-REFERENCE TO RELATED APPLICATIONS

This application claims priority to Italian Application No. 102016000015826, filed on Feb. 16, 2016, which application is hereby incorporated herein by reference.

TECHNICAL FIELD

The description relates to driver circuits. One or more embodiments may find application in (pre)driver circuits for components such as, e.g., external MOS components.

BACKGROUND

So-called pre-driver circuits may be used, e.g., in the automotive field, both for commercial and passenger vehicles, with the capability of driving various kinds of electrical loads, such as safety loads and relays.

One exemplary load may be a lambda heater, that is, a heater associated to a lambda probe as used for monitoring motor car emissions, particularly the contents of oxygen and other gases. Such a probe may operate satisfactorily if heated by a heat source to maintain a certain temperature. A heater driven by a pre-driver may be used for that purpose.

To that effect, circuits may be devised which are capable of driving—distinctly—a High Side MOS (either NMOS or PMOS) or a Low Side MOS (e.g., NMOS).

The need is thus still felt for improved arrangements which, e.g., may be able to manage all of these three possible configurations.

SUMMARY

One or more embodiments provide an arrangement capable of managing different application scenarios with a single layout.

One or more embodiments may relate to a corresponding device (e.g., a device for use in the automotive field, e.g., a lambda heater) including such a driver circuit as well as to a corresponding method.

One or more embodiments may provide a circuit able to drive all of a variety of possible configurations (e.g., N High Side, P High Side, N Low Side), with a capability of being used in a wide gamut of application scenarios.

Contrary to solutions which have a limited possibility of driving external components (e.g., driving an external NMOS in either of a High Side or a Low Side configuration, with a different circuit for PMOS driving) one or more embodiments make it possible to drive N-type or P-type MOSFETs with a single layout that reuses in both cases a voltage regulation loop to turn ON the external MOS.

One or more embodiments may thus be able to drive a variety of (notionally all) possible configurations of external components (e.g., MOSFET's, briefly MOS's).

One or more embodiments may dispense with limitations of existing solutions by resorting to a (pre)driver layout which may be compatible with a variety of existing application scenarios and expectedly with future possible configurations.

One or more embodiments may permit saving silicon area, using a small number of pins and increasing circuit flexibility.

One or more embodiments may include two output terminals or pins for coupling, e.g., to the gate and the source of an external component such as a MOS.

In one or more embodiments one pin may be coupled to the gate of an external NMOS or the source of an external PMOS, with the other pin coupled to the source of an external NMOS or the gate of an external PMOS.

BRIEF DESCRIPTION OF THE DRAWINGS

One or more embodiments will now be described, purely by way of example, with reference to the annexed figures, in which:

FIGS. 1 to 3 are exemplary of various configurations for driving a load via a component;

DETAILED DESCRIPTION OF ILLUSTRATIVE EMBODIMENTS

Figure 4:
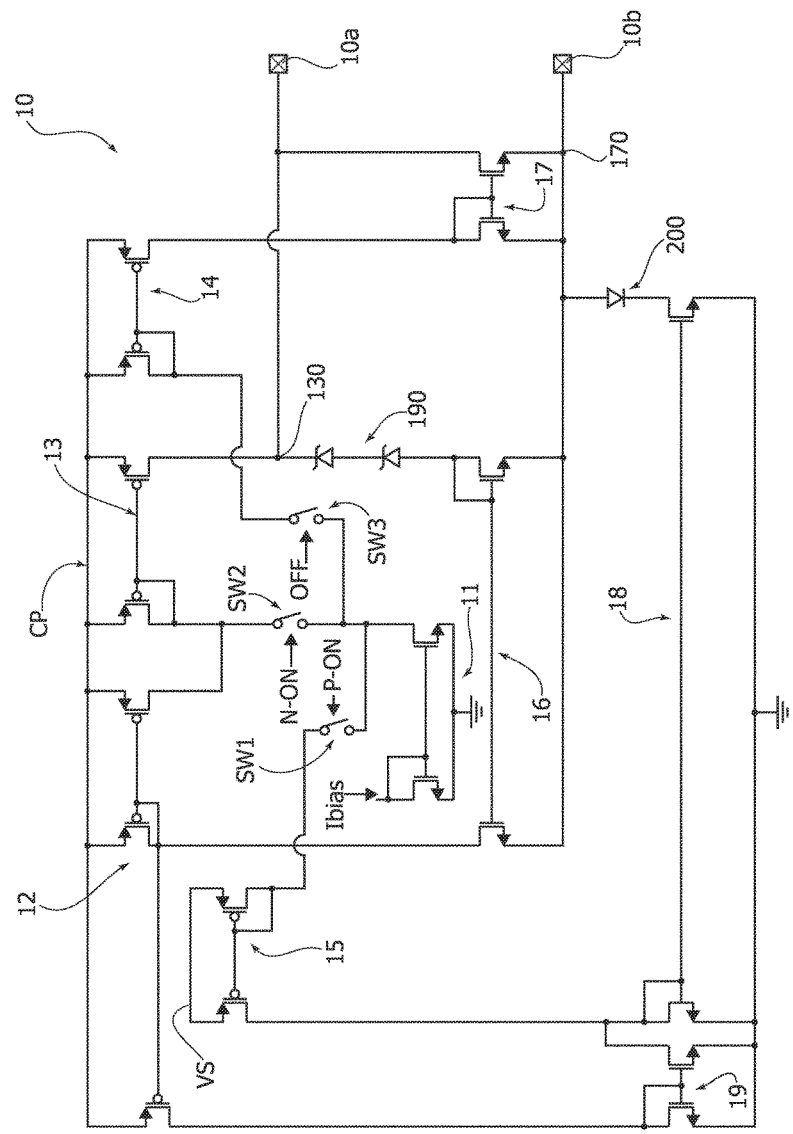
FIG. 4 is a circuit diagram exemplary of one or more embodiments.

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

One or more embodiments may relate to so-called pre-driver circuits, namely (analog) circuits able to drive an external component such as an electronic switch, e.g., by switching it alternatively ON or OFF.

A transistor, such as a MOSFET, briefly MOS (P-type or N-type) is exemplary of such an (external) component which in turn may drive a load L, e.g., a resistive and/or inductive load. A lambda heater as discussed previously may be exemplary of such a load L.

As exemplified in FIGS. 1 to 3, driving a component such as an electronic switch S (e.g., a MOS) may involve forcing a certain (controlled) voltage on the control electrode—e.g., gate—compared to another electrode—e.g., source—in the current line or path (e.g., source-drain) used to feed the load L.

Various possible circuit layouts may be resorted to for that purpose, e.g.:

High Side (HS), with an external MOS transistor (P-type or N-type) S set between an (external) battery line VB and a load L referred to ground: see, e.g., FIGS. 1 and 2;

Low Side (LS), with an external NMOS transistor S set between an (external) ground (shorted to the source) and a load L referred to the battery line VB: see, e.g., FIG. 3.

A High Side configuration may be used for driving an external load referred to ground. In that case an NMOS, with a gate GN and a source SN connected to the load L (FIG. 1), or a PMOS, with a gate GP and a source SP connected to the battery line VB (FIG. 2) may be used.

The adoption of one solution or another may be dictated by factors such as, e.g., the availability of a charge pump circuitry into the device (an external NMOS High Side may involve a gate voltage-over-battery drive in order to facilitate correct turn ON) and/or the cost of the external MOS.

A Low Side configuration may be used for driving an external load connected to the battery line VB as exemplified in FIG. 3. In that case, an external NMOS S can be used for that purpose, which in the ON case may be able to drive the second terminal of the external load L to ground; in a similar condition an external PMOS would have its gate voltage driven at a negative voltage.

As indicated, a demand exists for pre-driver circuits 10 capable of managing all of these possible configurations (High Side N, High Side P, Low Side) as exemplified in FIGS. 1 to 3. Such a pre-driver circuit would allow a user to extend the choice of possible applications where this kind of circuit can be used. Such a pre-driver circuit will also provide an improvement over circuits which can drive either an external High Side arrangement or, alternatively, a Low Side arrangement.

One or more embodiments are thus capable of driving external NMOS or PMOS components in High Side (HS) or Low Side (LS) configuration without having, e.g., to contemplate the possible presence of a combination of different circuits for HS and LS, which would result in a high cost solution in terms of silicon area.

One or more embodiments may provide, e.g., a gate-source voltage (VGS) of about 12V applied on the terminals of an external MOS when driving an external MOS ON, and about 0V when driving it OFF; such a VGS voltage may be equal to the value used for driving an external MOS in various target applications.

One or more embodiments may be used, e.g., for driving each and every one of the possible configurations of external components as illustrated in FIGS. 1 to 3, e.g., by turning the external component S "ON" as a result of a turn-on signal N-ON (see FIGS. 1 and 3) or P-ON (see FIG. 2) applied to a (pre)driver circuit 10 and turning the external component S "OFF" as a result of a turn-off signal OFF (see all of FIGS. 1 to 3) applied to the circuit 10.

One or more embodiments may thus increase the flexibility of possible application scenarios.

In one or more embodiments, a driver circuit 10 as exemplified herein may generate a voltage of, e.g., about 12V between the control terminal (e.g., gate) and another terminal (e.g., source) of an external MOS when driving it ON; to do this, in one or more embodiments an internal regulation loop may be provided, which may operate differently as a function of whether an NMOS or a PMOS is driven. The presence of such a loop may facilitate a satisfactory VGS regulation independently of, e.g., any charge pump value (provided the charge pump voltage is high enough to support a desired behavior for the circuit). It will otherwise be appreciated that the presence of such a charge pump is not strictly necessary, e.g., in the case the external switch S driven is a PMOS.

In one or more embodiments, a pre-driver circuit 10 may include two output terminals (pins) 10a, 10b which may be coupled to:

the gate GN and the source SN, respectively, of the High Side NMOS arrangement of FIG. 1; or the source SP and the gate GP, respectively, of the High Side PMOS arrangement of FIG. 2; or the gate GN and the source SN, respectively, of the Low Side NMOS arrangement of FIG. 3.

One or more embodiments may rely on the use of a set of current mirrors (e.g., 11 to 19 in the figures). In one or more embodiments, these may be implemented according to principles known to those of skill in the art, thus making it unnecessary to provide a more detailed description herein.

Figure 5:
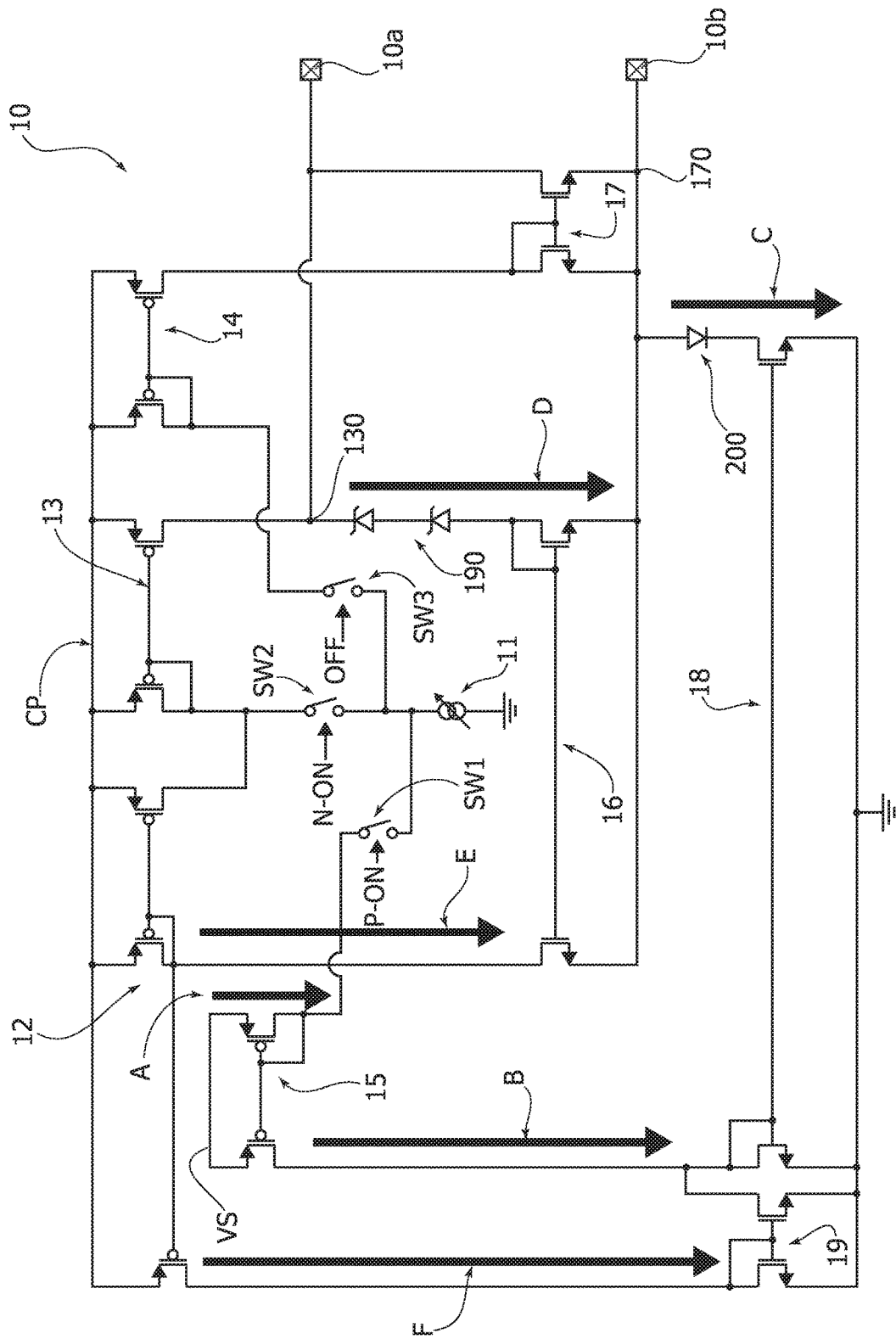
FIGS. 5 to 7 are representative of possible conditions of operation of the circuit exemplified in FIG. 4.
Figure 6:
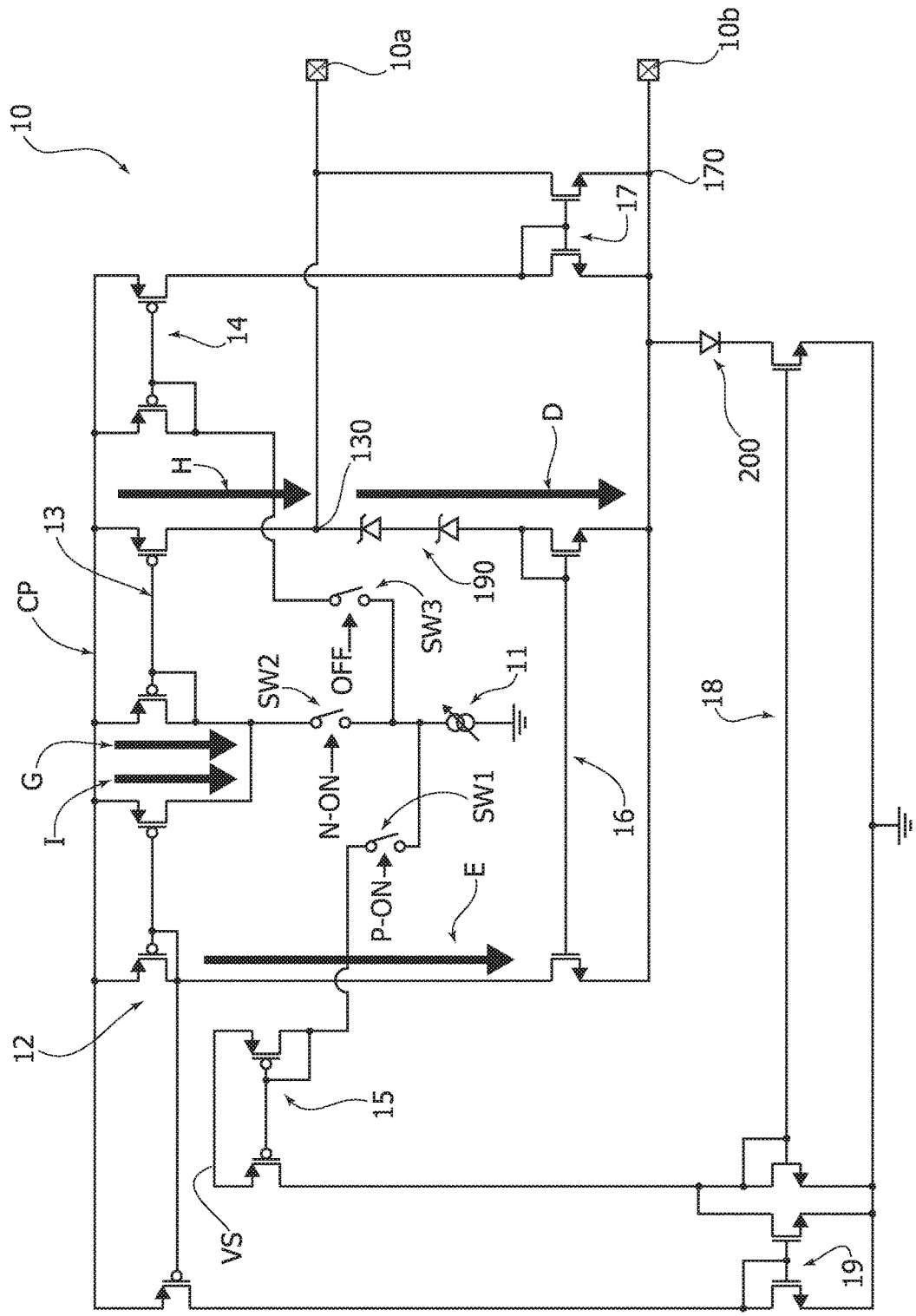
Figure 7:
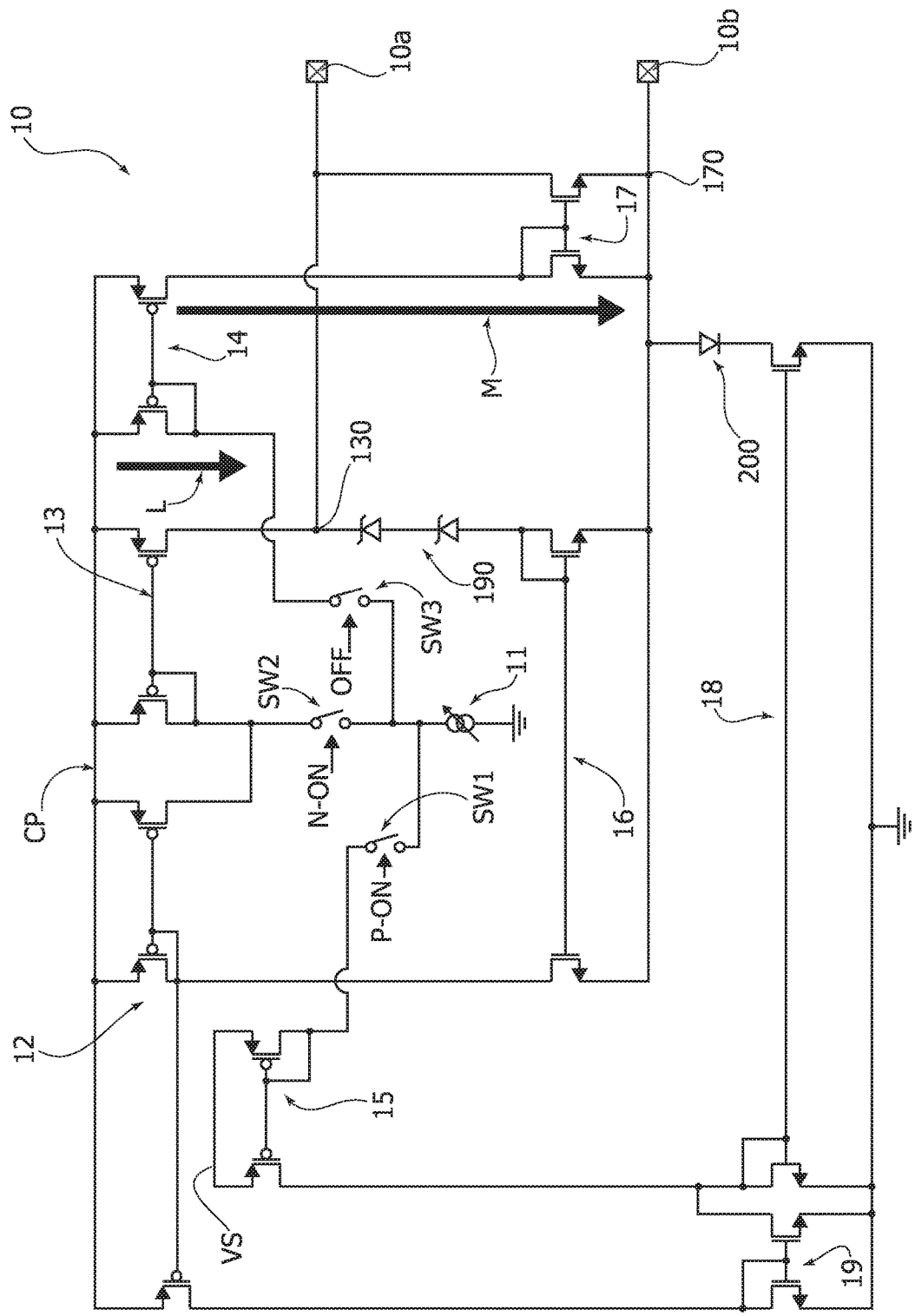

In one or more embodiments, a pre-driver circuit 10 as exemplified herein may be biased with a bias current Ibias (e.g., Ibias=10 uA) which is mirrored through a current mirror 11 (for simplicity this is represented schematically as a current generator in FIGS. 5 to 7).

In one or more embodiments, a pre-driver circuit 10 as exemplified herein may be coupled to a voltage source line VS (e.g., VS=3.3V) and a charge pump CP (e.g., high voltage up to 80V, assuming the battery voltage VB of FIGS. 1 to 3 may be, e.g., +15V).

In one or more embodiments, the bias current Ibias may be directed over three different paths through electronic switches (e.g., MOSFETs) SW1, SW2 and SW3.

In one or more embodiments, of these switches SW1, SW2 and SW3 just one switch may be ON (that is conductive) at a time according to the type (N-type or P-type) and connection arrangement (HS or LS) of the external switch S and as a function of the turn-on signals N-ON, P-ON, and the turn-off signal OFF applied as better detailed in the following.

In one or more embodiments, the switch SW1 may be coupled with a current mirror 15 which is supplied by the voltage source VS) and is in turn coupled with two further current mirrors 18 and 19 both referred to ground. In one or more embodiments, the current mirrors 18 and 19 may be coupled (in a manner known per se) in such a way that the current mirror 19 may control (e.g., reduce) the bias current of the current mirror 18.

In one or more embodiments, the switch SW2 may be coupled to a current mirror 13 supplied by the charge pump CP, the current mirror 13 being connected (at 130) to the output terminal 10a (which may be coupled, e.g., to the gate GN in FIGS. 1 and 3 or the source SP in FIG. 2).

In one or more embodiments, the switch SW3 may be coupled to a current mirror 14 supplied by the charge pump CP, with the current mirror 14 communicating with a current mirror 17 connected (at 170) to the output terminal 10b (which may be coupled, e.g., to the source SN in FIGS. 1 and 3 or the gate GP in FIG. 2).

In one or more embodiments a (pre)driver circuit 10 as exemplified herein may include two further current mirrors 12 and 16, a Zener diode arrangement 190 plus an output diode 200 connected and operated as better detailed in the following.

Possible operation of the exemplary circuit layout of FIG. 4 will now be described with reference to FIGS. 5 to 7. In FIGS. 5 to 7, parts or elements already described in the foregoing are indicated with the same references, without repeating a corresponding description.

For the sake of simplicity, the High Side PMOS arrangement of FIG. 2 will be considered first in connection with FIG. 5.

In one or more embodiments, the switch SW1 may be turned ON (that is, made conductive) by applying thereto a command signal P-ON when an external PMOS providing the switch S is intended to be turned on by making it conductive.

In that case (see, e.g., FIG. 2):

the terminal or pin 10a may be coupled to the source SP of the external PMOS, which may be assumed to be coupled to the battery line VB with a low impedance; and the terminal or pin 10b may be coupled to the gate terminal GP of the external PMOS.

In these conditions (as schematically represented by means of arrows in FIG. 5), the output current of the current mirror 11 may provide a bias for the current mirror 15 (arrow A in FIG. 5), which may in turn generate a new current towards the current mirror 18 (arrow B in FIG. 5). Once activated, the current mirror 18 will sink current (arrow C in FIG. 5), possibly via the output diode 200, from the terminal 10b, which will decrease its voltage level.

The voltage will continue to decrease until an internal clamp is activated.

In one or more embodiments such internal clamp may include the Zener diode arrangement 190 including e.g., two Zener diodes arranged with their cathodes facing towards the output terminal 10a and coupled with the current mirror 16, set between the Zener diode arrangement 190 and the output terminal bob.

When the voltage difference (arrow D in FIG. 5) between the two terminals 10a, 10b (here source SP and gate GP) reaches the clamp activation level (e.g., about 12V), the current mirror 16 will start generating a bias current to bias the current mirror 12 coupled to the charge pump CP (arrow E in FIG. 5). This will in turn activate the current mirror 19 (arrow F in FIG. 5) which may control the reduction of the bias current of the current mirror 18.

The arrangement as exemplified herein may be such that the higher the voltage difference between the two terminals or pins 10a, 10b, the higher the current flowing through the current mirror 19 will be: this will result in a corresponding reduction of the bias of the current mirror 18, so that the decrease of the voltage at the terminal bob will be stopped at a desired level (e.g., about 12V between the source and the gate of the external PMOS).

Possible operation of the NMOS arrangements of FIG. 1 (High Side) and FIG. 3 (Low Side) will now be considered in connection with FIG. 6.

In one or more embodiments, the switch SW2 may be turned ON (that is, made conductive) by applying thereto a command signal N-ON when an external NMOS providing the switch S is intended to be turned on by making it conductive. This irrespective of whether a High Side (HS) or Low Side (LS) layout is being considered.

In that case (see FIGS. 1 and 3):

the terminal or pin 10a may be coupled to the gate GN of the external NMOS; and the terminal or pin 10b may be coupled to the source terminal SN of the external NMOS.

In these conditions (as again schematically represented by means of arrows in FIG. 6), the output current from the current mirror 11 may be used to bias the current mirror 13 (arrow G in FIG. 6), which may in turn generate a new current (arrow H in FIG. 6) towards the node 130 coupled with the gate GN thus being able to increase the voltage level at the gate of the external NMOS.

The internal clamp arrangement 190, 16 will thus operate as described previously for the PMOS case, when the voltage difference (again arrow D in FIG. 6) between the two terminals 10a, 10b (here gate GN and source SN) reaches the clamp activation level (e.g., about 12V), with the current mirror 16 starting generating a bias current to bias the current mirror 12 (again arrow E in FIG. 6).

Due to the common coupling (e.g., to the switch SW2) as represented by arrows G and I in FIG. 6, the current mirror 12 will again produce a reduction in the bias current of the current mirror 13 that will stop its action when the voltage at 130 (here gate voltage GN) reaches a desired value as determined by the same internal clamp circuitry 190, 16 as used for the PMOS case discussed previously.

In one or more embodiments, the switch SW3 may be turned ON (that is, made conductive) by applying thereto a command signal OFF when an external component providing the switch S is intended to be turned off by making it non-conductive. This irrespective of whether NMOS or PMOS and irrespective of whether a High Side (HS) or Low Side (LS) layout is being considered.

The corresponding mode of operation (as schematically represented by means of arrows in FIG. 7) may thus apply to any one of the arrangements exemplified in FIGS. 1 to 3.

In that case, the output current from the current mirror 11 may be used to bias the current mirror 14 (arrow L in FIG. 7), with the current mirror 14 which generates a new current to the current mirror 17 (arrow M in FIG. 7).

This will result in the terminals 10a, 10b being shorted and produce turn OFF of the external component S: again, in one or more embodiments this may occur irrespective of whether the external component S is NMOS or PMOS and irrespective of whether a High Side (HS) or Low Side (LS) layout is being considered.

In one or more embodiments, MOS turn ON/OFF may be implemented with a controlled current on the gate of an external component, selectable, e.g., via an SPI interface.

In one or more embodiments, AMR (Absolute Maximum Rating, namely the maximum—positive or negative—voltage a pin can withstand while preserving device integrity) may be, with pins 10a and 10b coupled to the gate and source of an external NMOS, −14V as negative AMR and +80V for 10a and +60V for bob as positive AMR.

In one or more embodiments, the maximum differential voltage between 10a and 10b, namely V(10a)−V(10b), may be 20V (with circuit unpowered, namely with the voltage control loop between 10a and 10b inoperative).

One or more embodiments may not merely rely on the juxtaposition of plural blocks that operate in parallel, and may take advantage of the possible re-use of circuitry for different purposes: just by way of non-limiting example, it will be appreciated that a same clamp circuit (e.g., the Zener diode arrangement 190 having coupled therewith the current mirror 16) may be exploited for turning ON the external components, irrespective of the MOS type (N or P) and of the circuit layout (HS or LS) and for turning them OFF, thus saving silicon area.

One or more embodiments may thus generate a voltage of, e.g., 12V between the gate and source of an external MOS when this is intended to be driven ON, by activating an internal regulation loop which is different in the case of an external PMOS (FIG. 5) or an external NMOS (FIG. 6).

In one or more embodiments, such a loop may facilitate VGS regulation independently of the value of the charge pump CP (assuming that the charge pump voltage is high enough to permit correct operation of the circuit). Again, it will be appreciated that a charge pump may de facto be dispensed with in the case of an external PMOS.

One or more embodiments may thus provide a (pre)driver circuit 10 having a first and a second output terminal (e.g., 10a, 10b) for driving electronic switches (e.g., MOSFETs, either PMOS or NMOS) including a control terminal (e.g., a gate GN, GP, or possibly a base, in the case of a bipolar transistor or similar semiconductor switch) and a current path through the switch (e.g., source-drain in the case of a FET or possibly emitter-collector in the case of a bipolar transistor or similar semiconductor switch.

In one or more embodiments, coupling of the driver to the (external) electronic switch may include:
at least one first driving configuration, wherein (see, e.g., FIG. 2) the first and second output terminals of the driver circuit are coupled to the current path (e.g., to the source SP) and the control electrode (e.g., the gate GP) of an electronic switch (S, e.g., a PMOS), respectively, or
at least one second driving configuration, wherein (see, e.g., FIGS. 1 and 3) the first and second output terminals of the driver circuit are coupled to the control electrode (e.g., gate GN) and the current path (e.g., source SN) of an electronic switch (S, e.g., NMOS, both HS or LS), respectively.

In one or more embodiments, the driver circuit may include:
a bias current source (e.g., Ibias plus current mirror 11);
a first and a second turn-on switch (e.g., SW1, SW2) and a turn-off switch (e.g., SW3), the first and second turn-on switches and the turn-off switch coupled with the bias current source and alternatively activatable in an arrangement wherein with one of the first and second turn-on switch and the turn-off switch (SW3) conductive the two others of the first and second turn-on switches and the turn-off switch are non-conductive;
a first current mirror loop (e.g., current mirrors 15, 18, 16, 19) coupleable with the bias current source via the first turn-on switch to produce a voltage drop across the first and second output terminals in the at least one first driving configuration;
a second current mirror loop (e.g., current mirrors 12, 13, 16) coupleable with the bias current source via the second turn-on switch to produce a voltage drop across the first and second output terminals in the at least one second driving configuration;
a voltage clamp (e.g., 190) sensitive to the voltage across the first and second output terminals, the voltage clamp coupled (e.g., due to the presence of current mirror 16) to both the first current mirror loop and the second current mirror loop for maintaining the voltage across the first and second output terminals at a certain value in both the at least one first driving configuration and the at least one second driving configuration; and
a third current mirror loop (e.g., current mirrors 14, 17) coupleable with the bias current source via the turn-off switch to annul the voltage drop across the first and second output terminals in both the at least one first driving configuration and the at least one second driving configuration.

In one or more embodiments, the voltage clamp (e.g., 190) may be coupled (e.g., via the current mirror 16, common to both the first and the second current mirror loops):
to the first current mirror loop for maintaining the voltage across the first and second output terminals at a certain value in the at least one first driving configuration by controlling the current sunk by the first current mirror loop from the second output terminal, and
to the second current mirror loop for maintaining the voltage across the first and second output terminals at a certain value in the at least one second driving configuration by controlling the voltage applied by second current mirror loop to the first output terminal.

In one or more embodiments, the first current mirror loop may include:
a first current mirror path (e.g., current mirrors 15, 18) set between the first turn-on switch and the second output terminal, the first current mirror path coupled to the second output terminal to sink current from the second output terminal, and
a first current mirror clamp arrangement (e.g., current mirrors 16, 19) coupled to the voltage clamp and the first current mirror path, the first current mirror clamp arrangement configured for controlling the current sunk by the first current mirror path from the second output terminal and maintaining the voltage across the first and second output terminals at the certain value in the at least one first driving configuration.

In one or more embodiments, the first current mirror path may include a cascaded arrangement of:
a current mirror (e.g., current mirror 15) coupled to the first turn-on switch, and
a current mirror (e.g., current mirror 18) coupled to the second output terminal to sink current from the second output terminal.

In one or more embodiments, the first current mirror clamp arrangement may include a cascaded arrangement of:
a current mirror (e.g., 16) coupled to the voltage clamp, and
a current mirror (e.g., 19) coupled to the first current mirror path for controlling the current sunk thereby from the second output terminal.

In one or more embodiments the second current mirror loop may include:
a second current mirror path (e.g., current mirror 13) set between the second turn-on switch and the first output terminal, the second current mirror path coupled to the first output terminal to apply a voltage level to the first output terminal, and
a second current mirror clamp arrangement (e.g., current mirrors 16, 12) coupled to the voltage clamp and the second current mirror path, the second current mirror clamp arrangement configured for controlling the voltage applied by the second current mirror path to the first output terminal and maintaining the voltage across the first and second output terminals at the certain value in the at least one second driving configuration.

In one or more embodiments, the second current mirror path may include a current mirror (e.g., 13) coupled to the second turn-on switch and the first output terminal to apply a voltage to the first output terminal.

In one or more embodiments, the second current mirror clamp arrangement may include a cascaded arrangement of:
a current mirror (e.g., 16) coupled to the voltage clamp, and
a current mirror (e.g., 12) coupled to the second current mirror path for controlling the voltage applied by the second current mirror path to the first output terminal.

In one or more embodiments, the current mirror (e.g., 16) coupled to the voltage clamp is common to both the cascaded arrangements of the first current mirror clamp arrangement and the second current mirror clamp arrangement.

In one or more embodiments, the voltage clamp sensitive to the voltage across the first and second output terminals, includes at least one zener diode (e.g., 190) having its anode and cathode facing towards the second output terminal and the first output terminal, respectively.

In one or more embodiments, the third current mirror loop may include a turn-off current mirror path (e.g., current mirrors 14, 17) set between the turn-off switch and the first and second output terminals and configured to short circuit the first and second output terminals.

One or more embodiments may provide a device (e.g., a driver for a lambda probe heater or other various kinds of electrical loads L) including:

an electronic switch (S, e.g., PMOS or NMOS) with a control terminal (e.g., GN, GP) and a current path through the switch (e.g., SN, SP), a driver circuit 10 as exemplified in the foregoing coupled to the (external) electronic switch in a configuration selected out of:

at least one first driving configuration (e.g., PMOS—FIG. 2), wherein the first and second output terminals of the driver circuit are coupled to the current path and the control electrode of an electronic switch, respectively, or at least one second driving configuration (e.g., NMOS, both HS or LS—FIGS. 1 and 3), wherein the first and second output terminals of the driver circuit are coupled to the control electrode and the current path of an electronic switch, respectively.

In one or more embodiments:

the electronic switch may include a PMOS with the driver circuit coupled to the PMOS in the at least one first driving configuration, or, alternatively the electronic switch may includes an NMOS and the driver circuit is coupled to the NMOS in the at least one second driving configuration.

In one or more embodiments a method of driving (e.g., external) electronic switches including a control terminal and a current path through the switch by means of a driver circuit having a first and a second output terminal may include:

a) coupling to the switch a driver circuit 10 as exemplified in the foregoing, wherein the coupling is in either one of:

at least one first driving configuration, wherein the first and second output terminals of the driver circuit are coupled to the current path and the control electrode (GP) of an electronic switch, respectively, and at least one second driving configuration, wherein the first and second output terminals of the driver circuit are coupled to the control electrode and the current path of an electronic switch, respectively, b) when the coupling is in the at least one first driving configuration (e.g., PMOS), driving the switch by means of the first turn-on switch (SW1—signal P-ON I in FIG. 2) and the turn-off switch, c) when the coupling is in the at least one second driving configuration (e.g., NMOS, both HS, LS), driving the switch by means of the second turn-on switch (SW2—signal N-ON in FIGS. 1 and 3) and the turn-off switch.

Without prejudice to the underlying principles, the details and embodiments may vary, even significantly, with respect to what has been disclosed merely by way of example, without departing from the extent of protection.

The extent of protection is defined by the annexed claims.

What is claimed is:

1. A driver circuit with a first output terminal and a second output terminal for driving an electronic switch that includes a control terminal and a current path, the electronic switch being driven in a first driving configuration where the first and second output terminals of the driver circuit are coupled to the current path and the control terminal of an electronic switch, respectively, and in a second driving configuration where the first and second output terminals of the driver circuit are coupled to the control terminal and the current path of an electronic switch, respectively, wherein the driver circuit comprises:

a bias current source;

a first turn-on switch, a second turn-on switch and a turn-off switch coupled with the bias current source and being individually activatable in an arrangement where one of the first turn-on switch, the second turn-on switch and the turn-off switch is conductive while the other two of the first turn-on switch, the second turn-on switch and the turn-off switch are non-conductive;

a first current mirror loop coupled with the bias current source via the first turn-on switch to produce a voltage drop across the first and second output terminals in the first driving configuration;

a second current mirror loop coupled with the bias current source via the second turn-on switch to produce a voltage drop across the first and second output terminals in the second driving configuration;

a voltage clamp sensitive to the voltage drop across the first and second output terminals, the voltage clamp coupled to both the first current mirror loop and the second current mirror loop to maintain the voltage drop across the first and second output terminals at a certain value in both the first driving configuration and the second driving configuration; and a third current mirror loop coupled with the bias current source via the turn-off switch to annul the voltage drop across the first and second output terminals in both the first driving configuration and the second driving configuration.

2. The driver circuit of claim 1, wherein the voltage clamp is coupled to the first current mirror loop to maintain the voltage drop across the first and second output terminals at a certain value in the first driving configuration by controlling current sunk by the first current mirror loop from the second output terminal; and wherein the voltage clamp is coupled to the second current mirror loop to maintain the voltage drop across the first and second output terminals at a certain value in the second driving configuration by controlling a voltage applied by second current mirror loop to the first output terminal.

3. The driver circuit of claim 1, wherein the first current mirror loop comprises:

a first current mirror path set between the first turn-on switch and the second output terminal, the first current mirror path coupled to the second output terminal to sink current from the second output terminal; and a first current mirror clamp arrangement coupled to the voltage clamp and the first current mirror path, the first clamp current mirror arrangement configured to control the current sunk by the first current mirror path from the second output terminal and to maintain the voltage drop across the first and second output terminals at the certain value in the first driving configuration.

4. The driver circuit of claim 3, wherein the first current mirror path comprises a cascaded arrangement of:

a first current mirror coupled to the first turn-on switch; and a second current mirror coupled to the second output terminal to sink current from the second output terminal.

5. The driver circuit of claim 3, wherein the first current mirror clamp arrangement comprises a cascaded arrangement of:

a first current mirror coupled to the voltage clamp, and
a second current mirror coupled to the first current mirror path to control the current sunk thereby from the second output terminal.

6. The driver circuit of claim 1, wherein the second current mirror loop comprises:
a second current mirror path set between the second turn-on switch and the first output terminal, the second current mirror path coupled to the first output terminal to apply a voltage level to the first output terminal; and
a second current mirror clamp arrangement coupled to the voltage clamp and the second current mirror path, the second current mirror clamp arrangement configured to control a voltage applied by the second current mirror path to the first output terminal and to maintain the voltage drop across the first and second output terminals at the certain value in the second driving configuration.

7. The driver circuit of claim 6, wherein the second current mirror path comprises a current mirror coupled to the second turn-on switch and the first output terminal to apply a voltage to the first output terminal.

8. The driver circuit of claim 6, wherein the second current mirror clamp arrangement comprises a cascaded arrangement of:
a first current mirror coupled to the voltage clamp; and
a second current mirror coupled to the second current mirror path to control the voltage applied by the second current mirror path to the first output terminal.

9. The driver circuit of claim 1, wherein the voltage clamp comprises a Zener diode having its anode and cathode facing towards the second output terminal and the first output terminal, respectively.

10. The driver circuit of claim 1, wherein the third current mirror loop includes a turn-off current mirror path set between the turn-off switch and the first and second output terminals and configured to short-circuit the first and second output terminals.

11. A method of driving the driver circuit of claim 1, the method comprising:
coupling the driver circuit in the first driving configuration or the second driving configuration;
when the coupling is in the first driving configuration, driving the electronic switch by using the first turn-on switch and the turn-off switch; and
when the coupling is in the second driving configuration, driving the electronic switch using the second turn-on switch and the turn-off switch.

12. A device including:
an electronic switch with a control terminal and a current path through the electronic switch;
a driver circuit with a first output terminal coupled to the control terminal of the electronic switch and a second output terminal coupled to the current path of the electronic switch, wherein the driver circuit comprises:
a bias current source;
a first turn-on switch, a second turn-on switch and a turn-off switch coupled with the bias current source and being individually activatable in an arrangement where one of the first turn-on switch, the second turn-on switch and the turn-off switch is conductive while the other two of the first turn-on switch, the second turn-on switch and the turn-off switch are non-conductive;
a first current mirror loop coupled with the bias current source via the first turn-on switch to produce a voltage drop across the first and second output terminals in a first driving configuration;
a second current mirror loop coupled with the bias current source via the second turn-on switch to produce a voltage drop across the first and second output terminals in a second driving configuration;
a voltage clamp sensitive to the voltage drop across the first and second output terminals, the voltage clamp coupled to both the first current mirror loop and the second current mirror loop to maintain the voltage drop across the first and second output terminals at a certain value in both the first driving configuration and the second driving configuration; and
a third current mirror loop coupled with the bias current source via the turn-off switch to annul the voltage drop across the first and second output terminals in both the first driving configuration and the second driving configuration.

13. The device of claim 12, wherein the electronic switch comprises a PMOS transistor and the driver circuit is coupled to the PMOS transistor in the first driving configuration.

14. The device of claim 12, wherein the electronic switch comprises an NMOS transistor and the driver circuit is coupled to the NMOS transistor in the second driving configuration.

15. The device of claim 12, further comprising a lambda heater coupled to the current path of the electronic switch.

16. A driver circuit configured to drive an electronic switch having a control terminal and a current path through the electronic switch, the driver circuit having a first output terminal and a second output terminal, wherein the driver circuit is configured to be in a first driving configuration where the first and second output terminals of the driver circuit are coupled to the current path and the control terminal of the electronic switch, respectively, and in a second driving configuration where the first and second output terminals of the driver circuit are coupled to the control terminal and the current path of the electronic switch, respectively, wherein the driver circuit comprises:
a bias current source;
a first turn-on switch, a second turn-on switch and a turn-off switch coupled with the bias current source and being individually activatable in an arrangement where one of the first turn-on switch, the second turn-on switch and the turn-off switch is conductive while the other two of the first turn-on switch, the second turn-on switch and the turn-off switch are non-conductive;
a first current mirror loop coupled with the bias current source via the first turn-on switch to produce a voltage drop across the first and second output terminals in the first driving configuration;
a second current mirror loop coupled with the bias current source via the second turn-on switch to produce a voltage drop across the first and second output terminals in the second driving configuration;
a voltage clamp sensitive to the voltage drop across the first and second output terminals, the voltage clamp coupled to both the first current mirror loop and the second current mirror loop to maintain the voltage drop across the first and second output terminals at a certain value in both the first driving configuration and the second driving configuration; and
a third current mirror loop coupled with the bias current source via the turn-off switch to annul the voltage drop across the first and second output terminals in both the first driving configuration and the second driving configuration;

wherein the first current mirror loop comprises a first current mirror path set between the first turn-on switch the second output terminal, the first current mirror path coupled to the second output terminal to sink current from the second output terminal;

wherein the first current mirror loop further comprises a first current mirror clamp arrangement coupled to the voltage clamp and the first current mirror path, the first clamp current mirror arrangement configured to control the current sunk by the first current mirror path from the second output terminal and to maintain the voltage drop across the first and second output terminals at the certain value in the first driving configuration;

wherein the second current mirror loop comprises a second current mirror path set between the second turn-on switch and the first output terminal, the second current mirror path coupled to the first output terminal to apply a voltage level to the first output terminal; and wherein the second current mirror loop further comprises a second current mirror clamp arrangement coupled to the voltage clamp and the second current mirror path, the second current mirror clamp arrangement configured to control a voltage applied by the second current mirror path to the first output terminal and to maintain the voltage drop across the first and second output terminals at the certain value in the second driving configuration.

17. The driver circuit of claim 16, wherein the first current mirror path includes a cascaded arrangement of a current mirror coupled to the first turn-on switch and a current mirror coupled to the second output terminal to sink current from the second output terminal.

18. The driver circuit of claim 17, wherein the second current mirror path includes a current mirror coupled to the second turn-on switch and the first output terminal to apply a voltage to the first output terminal.

19. The driver circuit of claim 18, wherein the first current mirror clamp arrangement includes a cascaded arrangement of current mirror coupled to the voltage clamp, and a current mirror coupled to the first current mirror path to control the current sunk thereby from the second output terminal; and wherein the second current mirror clamp arrangement includes a cascaded arrangement of a current mirror coupled to the voltage clamp and a current mirror coupled to the second current mirror path to control the voltage applied by the second current mirror path to the first output terminal.

20. The driver circuit of claim 16, wherein the first current mirror clamp arrangement includes a cascaded arrangement of a current mirror coupled to the voltage clamp, and wherein the second current mirror clamp arrangement includes a cascaded arrangement of the current mirror coupled to the voltage clamp.

* * * * *